(12) United States Patent
Xu

(10) Patent No.: US 9,406,701 B2
(45) Date of Patent: Aug. 2, 2016

(54) ARRAY SUBSTRATE AND METHOD FOR FABRICATING THE SAME, AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventor: Xiangyang Xu, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/428,450

(22) PCT Filed: May 27, 2014

(86) PCT No.: PCT/CN2014/078506
§ 371 (c)(1),
(2) Date: Mar. 16, 2015

(87) PCT Pub. No.: WO2015/096381
PCT Pub. Date: Jul. 2, 2015

(65) Prior Publication Data
US 2016/0020229 A1  Jan. 21, 2016

(30) Foreign Application Priority Data
Dec. 26, 2013  (CN) .......................... 2013 1 0736307

(51) Int. Cl.
| | |
|---|---|
| *H01L 27/12* | (2006.01) |
| *H01L 29/786* | (2006.01) |
| *H01L 29/417* | (2006.01) |
| *H01L 29/66* | (2006.01) |

(52) U.S. Cl.
CPC .......... *H01L 27/1225* (2013.01); *H01L 27/124* (2013.01); *H01L 27/127* (2013.01); *H01L 29/41733* (2013.01); *H01L 29/66742* (2013.01); *H01L 29/7869* (2013.01)

(58) Field of Classification Search
CPC . H01L 27/1225; H01L 27/124; H01L 27/127; H01L 29/41733; H01L 29/66742; H01L 29/7869
See application file for complete search history.

(56) References Cited

U.S. PATENT DOCUMENTS

| | | | |
|---|---|---|---|
| 2011/0079776 | A1 | 4/2011 | Choi et al. |
| 2011/0220893 | A1 | 9/2011 | Kim et al. |
| 2012/0327321 | A1* | 12/2012 | Huang .................. G02F 1/1362 349/42 |

FOREIGN PATENT DOCUMENTS

| | | |
|---|---|---|
| CN | 102034745 A | 4/2011 |
| CN | 102820317 A | 12/2012 |
| CN | 103715203 A | 4/2014 |

OTHER PUBLICATIONS

International Patent Application No. PCT/CN2014/078506, International Search Report dated Sep. 3, 2014, twelve (12) pages.
Chinese Patent Application No. 201310736307.3, Office Action dated Sep. 28, 2015, seven (7) pages, English translation, three (3) pages.

* cited by examiner

*Primary Examiner* — Whitney T Moore
(74) *Attorney, Agent, or Firm* — Nath, Goldberg & Meyer; Joshua B. Goldberg; Christopher Thomas

(57) ABSTRACT

The present invention provides an array substrate comprising a plurality of data lines, a plurality of gate lines and a plurality of oxide thin film transistors, the plurality of data lines and the plurality of gate lines intersect with each other in different planes to divide the array substrate into a plurality of pixel units, in each of which the oxide thin film transistor is provided, the array substrate further comprises a metal oxide layer provided at least below a portion of the data line overlapping with the gate line, and an upper surface of the metal oxide layer is in contact with a lower surface of the data line. The present invention further provides a method for fabricating the array substrate and a display device comprising the array substrate.

12 Claims, 3 Drawing Sheets

B-B

A-A

B-B

ARRAY SUBSTRATE AND METHOD FOR FABRICATING THE SAME, AND DISPLAY DEVICE

This is a National Phase Application filed under 35 U.S.C. 371 as a national stage of PCT/CN2014/078506, filed May 27, 2014, and claims priority benefit from Chinese Application No. 201310736307.3, filed Dec. 26, 2013, the content of each of which is hereby incorporated by reference in its entirety.

FIELD OF THE INVENTION

The present invention relates to the field of display technology, and particularly to an array substrate, a method for fabricating the array substrate and a display device.

BACKGROUND OF THE INVENTION

A display panel of a display device comprises an array substrate. The array substrate comprises a plurality of gate lines and a plurality of data lines intersecting with each other in different planes. The gate lines and the data lines divide the array substrate into a plurality of pixel units, and a thin film transistor is provided in each pixel unit. Generally, the thin film transistor in the conventional array substrate is an amorphous silicon thin film transistor, and a mobility of the amorphous silicon thin film transistor is about 0.5 cmWs.

As a size of the panel display has been continuously increased in recent years, a frequency of a driving circuit is continuously increased, and the mobility of the existing amorphous silicon thin film transistor can hardly meet the demand. For example, when a size of a liquid crystal display exceeds 80 inches, a driving frequency should be 120 Hz. In this case, the mobility of the thin film transistor is required to be larger than 1 cmWs, and thus apparently, the mobility of the existing amorphous silicon thin film transistor can hardly meet the above requirement.

An oxide thin film transistor has advantages of high mobility, good uniformity, transparency, simple fabricating process and the like, and can better meet the requirement on the mobility of the thin film transistor for a large-size display.

FIG. 1 is a cross-sectional view illustrating a typical array substrate comprising the oxide thin film transistor. As shown in FIG. 1, since a hydrogen bond has much influence on an active layer made of metal oxide, the array substrate comprises an etch stop layer 20 provided on an active layer 10 of the oxide thin film transistor, and a source 30 and a drain 40 of the oxide thin film transistor are connected with the active layer 10 of the oxide thin film transistor through via holes penetrating through the etch stop layer 20, so that etchant may be prevented from penetrating into the active layer when etching the source and the drain of the oxide thin film transistor.

Generally, the etch stop layer 20 is made by use of silicon oxide in order to save the fabricating cost. However, since the compactness of the silicon oxide is poor, bubble-shaped gaps exist between the source and drain metal layer and the etch stop layer 20 in the thin film transistor. When etching the source and drain metal layer, the etchant may penetrate into contact surfaces between a data line 50 and the etch stop layer 20 along the bubble-shaped gaps, resulting in corrosion of portions of the data line 50 connected with the source 30 of the thin film transistor, thereby reducing the overall quality of the array substrate.

Therefore, how to prevent the etchant from corroding the portions of the data line connected with the source of the thin film transistor becomes a problem to be solved in the art.

SUMMARY OF THE INVENTION

An object of the present invention is to provide an array substrate, a method for fabricating the same, and a display device comprising the array substrate. Portions of data lines connected with sources of thin film transistors in the array substrate are not likely to be corroded.

To achieve the above object, as one aspect of the present invention, there is provided an array substrate, comprising a plurality of data lines, a plurality of gate lines and a plurality of oxide thin film transistors, the plurality of data lines and the plurality of gate lines intersect with each other in different planes to divide the array substrate into a plurality of pixel units, in each of which the oxide thin film transistor is provided, the array substrate further comprises a metal oxide layer provided at least below a portion of the data line overlapping with the gate line, and an upper surface of the metal oxide layer is in contact with a lower surface of the data line.

The metal oxide layer may be provided at each overlapping portion of the data line with the gate line, a width of the metal oxide layer may be equal to a width of the data line, and a length of the metal oxide layer may be equal to a width of the gate line.

Alternatively, a size of the metal oxide layer may correspond to that of the data line.

The metal oxide layer may be made of the same material as an active layer of the oxide thin film transistor. An etch stop layer may be provided on the active layer of the oxide thin film transistor.

The metal oxide layer may be made of any one of ZnO, InZnO, ZnSnO, GaInZnO and ZrInZnO.

In the array substrate, a source and a drain of the oxide thin film transistor may be provided above the active layer of the oxide thin film transistor, the source and the drain of the oxide thin film transistor may be connected with the active layer through a first via hole and a second via hole penetrating the etch stop layer, respectively, and the data line may be in contact with the metal oxide layer in such a manner that at least a part of the data line is formed within a trench penetrating the etch stop layer.

In the array substrate, alternatively, the active layer of the oxide thin film transistor may include a source covered region, a drain covered region and an etch stop layer covered region provided between the source covered region and the drain covered region, the metal oxide layer may include a source oxide layer provided at one side of the active layer and connected with the source covered region, a drain oxide layer provided at the other side of the active layer and connected with the drain covered region, and a data line oxide layer provided below the data line and in contact with a lower surface of the data line. One part of a lower surface of the source of the oxide thin film transistor may be in contact with the source covered region, and the other part thereof may be in contact with the source oxide layer, one part of a lower surface of the drain of the oxide thin film transistor may be in contact with the drain covered region, and the other part thereof may be in contact with the drain oxide layer, a lower surface of the etch stop layer may be only in contact with the etch stop layer covered region.

As another aspect of the present invention, there is provided a method for fabricating an array substrate, and the method comprises steps of: forming a pattern comprising a gate line; forming a pattern comprising an active layer of a thin film transistor; forming a pattern comprising a metal oxide layer; and forming a pattern comprising a data line, a source and a drain of the thin film transistor, wherein the metal oxide layer is provided at least below a portion of the data line overlapping with the gate line, and an upper surface of the metal oxide layer is in contact with a lower surface of the data line.

The metal oxide layer may be provided in the same layer as the active layer of the thin film transistor, the metal oxide layer may be made of the same material as the active layer of the thin film transistor, and the patterns comprising the active layer of the thin film transistor and the metal oxide layer may be formed in a same patterning process.

In the above method, between the step of forming the pattern comprising the metal oxide layer and the step of forming the pattern comprising the data line and the source and the drain of the thin film transistor, the method may further comprise steps of: forming a pattern comprising an etch stop layer, which is provided on the active layer; and forming a first via hole, a second via hole and a data line trench, wherein both of the first via hole and the second via hole penetrate through the etch stop layer to reach the active layer of the thin film transistor, and the data line trench penetrates through the etch stop layer to reach the metal oxide layer. In the step of forming the pattern comprising the data line and the source and the drain of the thin film transistor, the source may be connected with the active layer through the first via hole, the drain may be connected with the active layer through the second via hole, the data line may be provided in the data line trench, and the lower surface of the data line may be in contact with the metal oxide layer.

In the above method, alternatively, the active layer of the thin film transistor may include a source covered region, a drain covered region and an etch stop layer covered region provided between the source covered region and the drain covered region, the metal oxide layer may include a source oxide layer provided at one side of the active layer and connected with the source covered region, a drain oxide layer provided at the other side of the active layer and connected with the drain covered region, and a data line oxide layer provided below the data line and in contact with the lower surface of the data line. One part of the lower surface of the source may be in contact with the source covered region, the other part thereof may be in contact with the source oxide layer, one part of the lower surface of the drain may be in contact with the drain covered region, and the other part thereof may be in contact with the drain oxide layer. Between the step of forming the pattern comprising the metal oxide layer and the step of forming the pattern comprising the data line and the source and the drain of the thin film transistor, the method may further comprise a step of forming a pattern comprising an etch stop layer, which is provided on the active layer and covers only the etch stop layer covered region.

In the above method, the metal oxide layer may be made of any one of ZnO, InZnO, ZnSnO, GaInZnO and ZrInZnO.

As yet another aspect of the present invention, there is provided a display device, comprising the above array substrate according to the embodiments of the present invention.

In the array substrate according to the embodiments of the present invention, the data line and the source and the drain of the oxide thin film transistor are all made of metal (e.g., any one of aluminum, molybdenum and copper), and corrosion resistance of the metal oxide layer is stronger than that of the metal material. Therefore, when the pattern comprising the source, the drain and the data line is formed by etching, the lower surface of the portion of the data line connected with the source of the thin film transistor, i.e. the lower surface of the portion of the data line overlapping with the gate line, is prevented from being corroded by the etchant by providing the metal oxide layer below the portion of the data line connected with the source of the thin film transistor, i.e. below the portion of the data line overlapping with the gate line. Further, the data line is prevented from being corroded by the etchant due to the bubble-shaped gaps existing between the metal layer and the etch stop layer by providing the data line on the upper surface of the metal oxide layer different from the etch stop layer, and thus the overall quality of the array substrate is improved.

BRIEF DESCRIPTION OF THE DRAWINGS

The accompanying drawings, which constitute a part of specification, are used for providing further understanding of the present invention, and are used for explaining the present invention together with the following specific implementations, but are not intended to limit the present invention. In the drawings.

DESCRIPTION OF THE PREFERRED EMBODIMENT

The specific implementations of the present invention will be described below in details in conjunction with the accompanying drawings. It should be understood that the specific implementations described herein are used for describing and explaining the present invention, rather than limiting the present invention.

As an aspect of the present invention, as shown in FIGS. 2 through 5, in a first embodiment of an array substrate according to embodiments of the present invention, there is provided an array substrate that comprises a plurality of data lines 50, a plurality of gate lines 92 and a plurality of oxide thin film transistors, and the plurality of data lines 50 and the plurality of gate lines 92 intersect with each other in different planes to divide the array substrate into a plurality of pixel units, in each of which the oxide thin film transistor is provided. The array substrate further comprises an oxide layer 60 provided at least below a portion of the data line 50 overlapping with the gate line 92, and an upper surface of the oxide layer 60 is in contact with a lower surface of the data line 50.

The data line 50, a source 30 and a drain 40 of the oxide thin film transistor are all made of metal (e.g., any one of aluminum, molybdenum and copper), and corrosion resistance of the oxide layer 60 is stronger than that of the metal material. Therefore, when a pattern comprising the source 30, the drain 40 and the data line 50 is formed by etching, a portion of the data line 50 connected with the source 30 of the thin film transistor, i.e., a lower surface of a portion of the data line 50 overlapping with the gate line 92 is prevented from being corroded by an etchant by providing the oxide layer 60 below the portion of the data line 50 connected with the source 30, i.e., below the portion of the data line 50 overlapping with the gate line 92, and thus the overall quality of the array substrate is improved.

It should be noted that, the orientational words such as "above" and "below" (or "upper" and "lower") in the present invention refer to the orientations of "above" and "below" shown in FIGS. 3 and 5. In addition, in FIG. 2, the pattern of the gate line 92 includes the pattern of the gate 90, but the present invention is not limited thereto.

In the embodiment of the present invention, the oxide layer 60 may be only provided below the portion of the data line 50 overlapping with the gate line 92. In addition, the oxide layer may be provided at each overlapping portion of the data line with the gate line, a width of the oxide layer is equal to the width of the data line, and a length of the oxide layer is equal to the width of the gate line.

Figure 1:
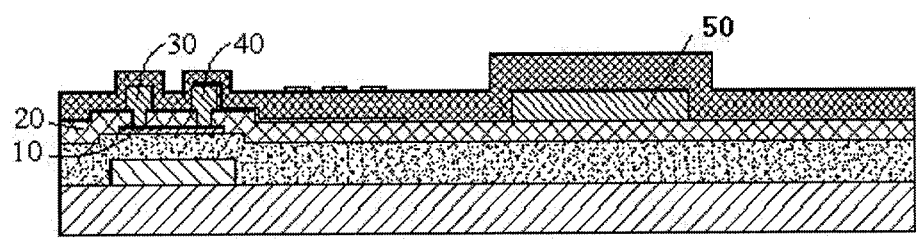
FIG. 1 is a cross-sectional view of a part of an array substrate in the prior art.
Figure 2:
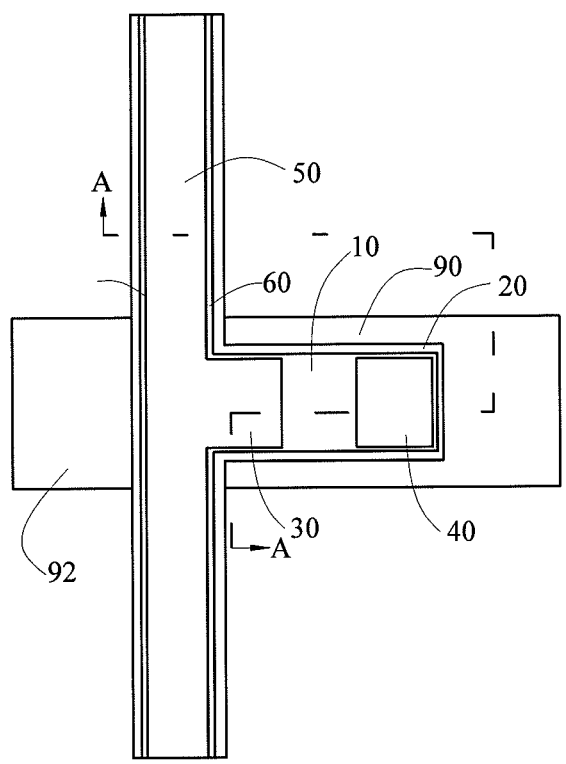
FIG. 2 is a top view of a first embodiment of an array substrate according to embodiments of the present invention.

Alternatively, the oxide layer 60 may be provided below the entire data line 50 and has a size corresponding to that of the data line 50, as shown in FIG. 2, thereby better protecting the lower surface of the data line 50 from corrosion and improving the overall quality of the array substrate.

In the embodiment of the present invention, there is no specific limit to the material of the oxide layer, as long as the oxide layer has a stronger corrosion resistance than the metal forming the data line 50. To simplify the fabricating process and improve the production efficiency of the array substrate, the oxide layer 60 may be made of the same material as that of the active layer 10 of the oxide thin film transistor. For example, the active layer 10 may be made of any one of ZnO, InZnO, ZnSnO, GaInZnO and ZrInZnO. Compared with the metal material used to fabricate the data line 50, the above material has better corrosion resistance and better flexibility.

In addition, an etch stop layer 20 may be provided on the active layer 10 so as to prevent an etchant from penetrating into the active layer when etching the source and the drain of the oxide thin film transistor.

Since the oxide layer 60 is made of the same material as that of the active layer 10, the oxide layer 60 and the active layer 10 may be formed simultaneously in a same patterning process.

In the embodiment of the present invention, there is no specific limit to the structure of the oxide thin film transistor. For example, as shown in FIGS. 2 and 3, the source 30 and the drain 40 of the oxide thin film transistor are provided above the active layer 10 of the oxide thin film transistor, and the source 30 and the drain 40 of the oxide thin film transistor are connected with the active layer 10 through a first via hole 31 and a second via hole 41 penetrating through the etch stop layer 20, respectively. The data line 50 is formed on an upper surface of the active layer 60, and is in contact with the oxide layer 60 in such a manner that at least a part of the data line 50 is formed within a trench penetrating through the etch stop layer 20.

Figure 3:
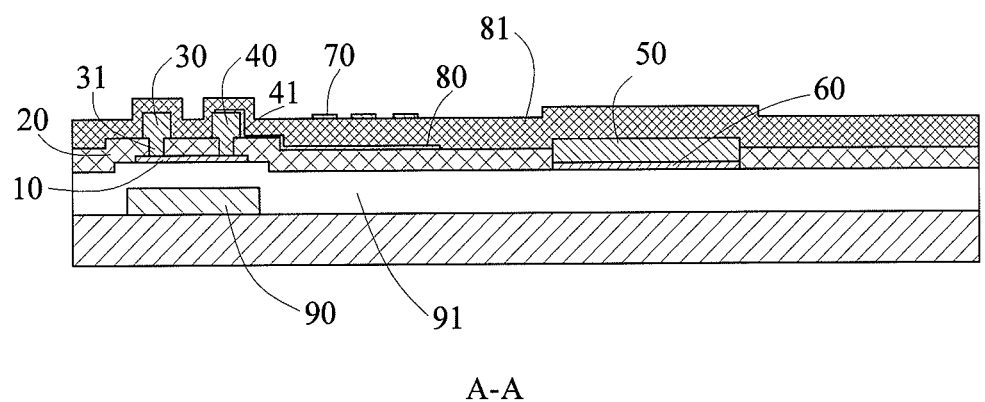
FIG. 3 is a cross-sectional view of the array substrate taken along polygonal line A-A in FIG. 2.

It should be noted that, FIG. 3 is only a schematic diagram that adaptively illustrates a positional relationship between the etch stop layer and the oxide active layer, which is not an actual relationship of size between the etch stop layer and the oxide active layer. In the shown array substrate, the oxide thin film transistor has a bottom gate structure, and thus the gate 90 is provided below the active layer 10, a gate insulation layer 91 is provided between the gate 90 and the active layer 10, the active layer 10 and the oxide layer 60 are provided on an upper surface of the gate insulation layer 91, and the etch stop layer 20 covers the whole substrate. In addition, the data line 50 is in contact with the oxide layer 60 through the trench penetrating through the etch stop layer 20 and is formed on the upper surface of the oxide layer 60, the data line 50 is connected with the source 30 of the oxide thin film transistor. Of course, the etch stop layer 20 may only cover the active layer 10.

It should be understood that, a common electrode 70, a pixel electrode 80 and a passivation layer 81 in FIG. 3 are omitted in FIG. 2. In the implementation shown in FIG. 3, the common electrode 70 is provided above the pixel electrode 80, and the pixel electrode 80 is directly connected with the drain 40 of the oxide thin film transistor. The gate insulation layer 91 and the etch stop layer 20 may be both made of silicon oxide.

Figure 4:
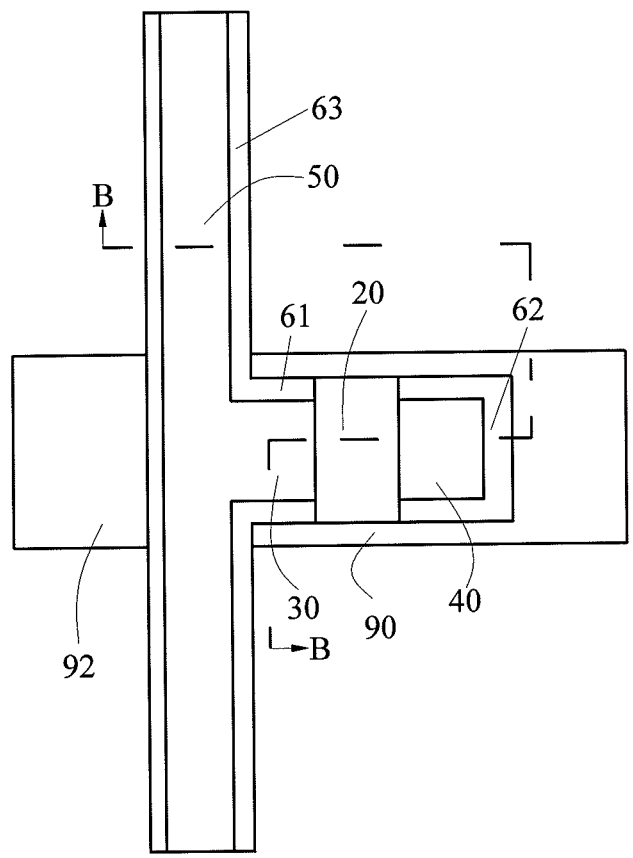
FIG. 4 is a top view of a second embodiment of an array substrate according to embodiments of the present invention.

In a second embodiment of the array substrate according to the embodiments of the present invention, the structures different from those in the first embodiment will be mainly described. As shown in FIGS. 4 and 5, an active layer 10 of the thin film transistor may include a source covered region 11, a drain covered region 13 and an etch stop layer covered region 12 provided between the source covered region 11 and the drain covered region 13. An oxide layer may include a source oxide layer 61 provided at one side of the active layer 10 and connected with the source covered region 11, a drain oxide layer 62 provided at the other side of the active layer 10 and connected with the drain covered region 13, and a data line oxide layer 63 provided below the data line and in contact with a lower surface of the data line. One part of a lower surface of the source 30 of the thin film transistor is in contact with the source covered region 11, and the other part is in contact with the source oxide layer 61. One part of a lower surface of the drain 40 of the thin film transistor is in contact with the drain covered region 13, and the other part is in contact with the drain oxide layer 62. A lower surface of the etch stop layer 20 is in contact with the etch stop layer covered region 12.

Figure 5:
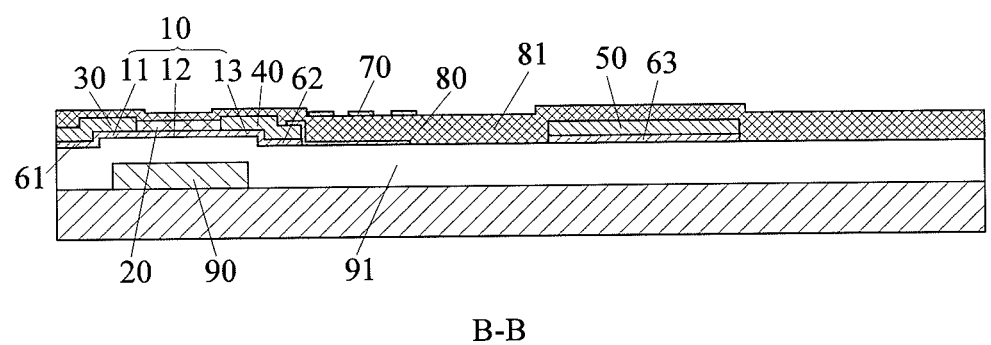
FIG. 5 is a cross-sectional view of the array substrate taken along polygonal line B-B in FIG. 4.

As shown in FIGS. 4 and 5, the etch stop layer 20 is only provided on the etch stop layer covered region 12, and the data line oxide layer 63 is provided below a portion of the data line 50 other than the portion connected with the source 30, so as to fully protect the data line 50. In this case, as shown in FIGS. 4 and 5, the data line oxide layer 63 may be formed on a gate insulation layer and provided in the same layer as the active layer 10, and a passivation layer 81 covers the data line 50, the source 30 and the drain 40. It can be easily understood that, a pixel electrode and a common electrode in FIG. 5 are omitted in FIG. 4.

In the embodiment of the present invention, the etch stop layer 20 may be made by use of silicon oxide (e.g. $SiO_2$) and/or silicon nitride ($SiN_x$).

It can be easily understood that, although both of the oxide thin film transistors have bottom gate structures in the first and second embodiments of the array substrate, the present invention is not limited thereto. The oxide thin film transistor in the array substrate according to the embodiments of the present invention may also have a top gate structure.

As another aspect of the present invention, there is provided a method for fabricating the above array substrate, and the method comprises steps of: forming a pattern comprising a gate line; forming a pattern comprising an active layer of a thin film transistor; forming a pattern comprising a metal oxide layer; and forming a pattern comprising a data line, a source and a drain of the thin film transistor, the oxide layer being provided at least below a portion of the data line overlapping with the gate line, and an upper surface of the oxide layer being in contact with a lower surface of the data line.

The oxide layer can protect a lower surface of the portion of the data line overlapping with the gate line from being corroded by an etchant penetrating along gaps between the data line and surrounding materials of the data line. The oxide layer can prevent the portion of the data line connected with the source of the thin film transistor from being corroded by the etchant.

To better protect the data line, the oxide layer may correspond to the entire data line. That is, the entire lower end surface of the data line may be in contact with the upper surface of the oxide layer, i.e., the data line may be formed on the upper surface of the oxide layer.

To simplify the fabricating method and improve the production efficiency, the oxide layer may be provided in the same layer as the active layer of the oxide thin film transistor, and the oxide layer may be made of the same material as the active layer of the thin film transistor. In this case, the fabricating method comprises forming the oxide layer while forming the active layer of the oxide thin film transistor. That is, the patterns comprising the active layer of the oxide thin film transistor and the oxide layer are formed in a same patterning process.

In the embodiment of the present invention, there is no limit to the type of the patterning process. For example, the active layer of the oxide thin film transistor and the oxide layer may be simultaneously formed by a patterning process such as transferring, printing, or the like. Alternatively, the oxide layer and the active layer may be formed by the following steps of: depositing an oxide film on a substrate firstly, and then forming a pattern comprising the active layer and the oxide layer by using a photolithographic process.

As described above, the active layer of the thin film transistor may be made of any one of ZnO, InZnO, ZnSnO, GaInZnO and ZrInZnO. The oxide layer may be made of any one of ZnO, InZnO, ZnSnO, GaInZnO and ZrInZnO.

To form the array substrate in the first embodiment of the present invention (i.e., the array substrate shown in FIGS. 2 and 3), the fabricating method may comprise, between the step of forming the pattern comprising the oxide layer 60 and the step of forming the pattern comprising the data line 50 and the source 30 and the drain 40 of the thin film transistor, the following sequential steps of: forming a pattern comprising an etch stop layer 20, the etch stop layer 20 being provided on the active layer 10 and the oxide layer 60; and forming a first via hole 31, a second via hole 41 and a data line trench, both of the first via hole 31 and the second via hole 41 penetrating through the etch stop layer 20 to reach the active layer 10 of the oxide thin film transistor, and the data line trench penetrating through the etch stop layer 20 to reach the oxide layer 60.

In this case, in the step of forming the pattern comprising the source 30, the drain 40 and the data line 50, the source 30 is connected with the active layer 10 through the first via hole 31 (the material of the active layer fills the first via hole to form a first electrode in the first via hole, and the first electrode connects the source to the active layer), the drain 40 is connected with the active layer 10 through the second via hole 41 (the material of the active layer fills the second via hole to form a second electrode in the second via hole, and the second electrode connects the drain to the active layer), and at least a part of the data line 50 is provided in the data line trench and is formed on the upper surface of the oxide layer 60.

Similarly, there is no limit to the process for forming the pattern comprising the source, the drain and the data line in the present invention, that is, the pattern comprising the source, the drain and the data line may be formed by a process such as printing, transferring or the like, or the pattern comprising the source, the drain and the data line may be formed by a conventional photolithographic process.

Hereinafter, the method for fabricating the array substrate shown in FIGS. 2 and 3 will be described in detail, and the method comprises the following steps of:

forming a pattern comprising the gate line 92 and the gate 90 of the oxide thin film transistor on a glass substrate;

forming the gate insulation layer 91;

forming a pattern comprising the oxide layer 60 and the active layer 10 of the thin film transistor;

forming the etch stop layer 20, wherein the etch stop layer 20 covers the glass substrate subjected to the above steps, i.e., covers the active layer 10 and the oxide layer 60;

forming the first via hole 31, the second via hole 41 and the data line trench, wherein the first via hole 31 and the second via hole 41 reach the active layer 10, and the data line trench reaches the oxide layer 60;

forming a pattern comprising the source 30, the drain 40 and the data line 50, wherein the source 31 is connected with the active layer 10 through the first via hole 31, the drain 40 is connected with the active layer 10 through the second via hole 41, at least a part (lower part) of the data line 50 is provided in the data line trench, and the lower surface of the data line 50 is in contact with the oxide layer 60;

forming a pattern comprising the pixel electrode 80, wherein a part of the pixel electrode 80 covers at least a part of the drain 40;

forming the passivation layer 81, wherein the passivation layer 81 covers the glass substrate subjected to the above steps; and forming a pattern comprising the common electrode 70.

In a method for fabricating the array substrate of the second embodiment of the present invention (i.e., the array substrate shown in FIGS. 4 and 5), the active layer of the thin film transistor includes the source covered region 11, the drain covered region 13 and the etch stop layer covered region 12 provided between the source covered region 11 and the drain covered region 13; the oxide layer includes the source oxide layer 61 provided at one side of the active layer and connected with the source covered region 11, the drain oxide layer 62 provided at the other side of the active layer and connected with the drain covered region 13, and the data line oxide layer 63.

In the above method for fabricating the array substrate, in the step of forming the pattern comprising the source, the drain and the data line, one part of the lower surface of the source is in contact with the source covered region, and the other part is in contact with the source oxide layer; one part of the lower surface of the drain is in contact with the drain covered region, and the other part is in contact with the drain oxide layer.

Hereinafter, the method for fabricating the array substrate shown in FIGS. 4 and 5 will be described in detail, and the method comprises the following steps of:

forming a pattern comprising the gate 90 and the gate line 92 on a glass substrate;

forming the gate insulation layer 91;

forming a pattern comprising the active layer and the oxide layer on the gate insulation layer 91;

forming a pattern comprising the etch stop layer 20, wherein the etch stop layer 20 cover only the etch stop covered region 12;

forming a pattern comprising the source 30, the drain 40 and the data line 50, wherein one part of the lower surface of the source 30 is in contact with the source covered region 11, and the other part thereof is in contact with the source oxide layer 61, one part of the lower surface of the drain 40 is in contact with the drain covered region 13, and the other part thereof is in contact with the drain oxide layer 62, and the data line 50 is formed on the upper surface of the data line oxide layer 63;

forming a pattern comprising the pixel electrode;

forming the passivation layer 81 on the glass substrate subjected to the above steps; and forming a pattern comprising the common electrode.

Compared with the method for fabricating the array substrate shown in FIGS. 2 and 3, it is unnecessary to form via holes in the method for fabricating the array substrate shown in FIGS. 4 and 5.

It can be easily understood that, after the source and the drain of the oxide thin film transistor is formed, the pixel electrode connected with the drain may be formed, then the passivation layer covering the substrate may be formed, and the common electrode may be finally formed on the passivation layer. These steps are well known in the art, and therefore are not described herein.

As another aspect of the present invention, there is provided a display device comprising the above array substrate provided in the present invention.

In the array substrate of the embodiments of the present invention, the data line, the source and the drain of the oxide thin film transistor are all made of metal (e.g., any one of aluminum, molybdenum and copper), and corrosion resistance of the oxide layer is stronger than that of the metal material. Therefore, when the pattern comprising the source, the drain and the data line is formed by etching, the lower surface of the portion of the data line connected with the source of the thin film transistor, i.e. the lower surface of the portion of the data line overlapping with the gate line is prevented from being corroded by the etchant by providing the oxide layer below the portion of the data line connected with the source of the thin film transistor, i.e. below the portion of the data line overlapping with the gate line. Further, the data line is prevented from being corroded by the etchant due to the bubble-shaped gaps existing between the metal layer and the etch stop layer by providing the data line on the upper surface of the oxide layer different from the etch stop layer, and thus the overall quality of the array substrate is improved.

Since the oxide thin film transistor that has relatively high mobility is utilized in the display device provided by the present invention, the display device provided by the present invention may have a relatively large area and may thus be applied to the electronic apparatus such as computer, TV, etc.

The display device in the present invention may be a liquid crystal panel, a liquid crystal display, a liquid crystal TV, an OLED display panel, an OLED display, and OLED TV, a cell phone, a PDA, an electronic book or the like.

It should be understood that the above implementations are merely exemplary embodiments used for explaining the principle of the present invention, but the present invention is not limited thereto. Various variations and improvements can be made by those skilled in the art without departing from the spirit and essence of the present invention, and these variations and improvements should also be considered to be within the protection scope of the present invention.

The invention claimed is:

1. An array substrate, comprising a plurality of data lines, a plurality of gate lines and a plurality of oxide thin film transistors, the plurality of data lines and the plurality of gate lines intersecting with each other in different planes to divide the array substrate into a plurality of pixel units, in each of which the oxide thin film transistor being provided, wherein the oxide thin film transistor comprises an active layer and a source and a drain which are connected with the active layer, the source is connected with the data line, the array substrate further comprises a metal oxide layer provided at least below a portion of the data line overlapping with the gate line, and an upper surface of the metal oxide layer is in contact with a lower surface of the data line, and an etch stop layer is provided on the active layer of the oxide thin film transistor, wherein the active layer of the oxide thin film transistor includes a source covered region, a drain covered region and an etch stop layer covered region provided between the source covered region and the drain covered region, the metal oxide layer includes a source oxide layer provided at one side of the active layer and connected with the source covered region, a drain oxide layer provided at the other side of the active layer and connected with the drain covered region, and a data line oxide layer provided below the data line and in contact with a lower surface of the data line, one part of a lower surface of the source of the oxide thin film transistor is in contact with the source covered region, and the other part thereof is in contact with the source oxide layer, one part of a lower surface of the drain of the oxide thin film transistor is in contact with the drain covered region, and the other part thereof is in contact with the drain oxide layer, a lower surface of the etch stop layer is only in contact with the etch stop layer covered region.

2. The array substrate according to claim 1, wherein the metal oxide layer is provided at each overlapping portion of the data line with the gate line, a width of the metal oxide layer is equal to that of the data line, and a length of the metal oxide layer is equal to a width of the gate line.

3. The array substrate according to claim 1, wherein a width and a length of the metal oxide layer correspond to those of the data line, respectively.

4. The array substrate according to claim 1, wherein the metal oxide layer is made of the same material as the active layer of the oxide thin film transistor.

5. The array substrate according to claim 4, wherein the metal oxide layer is made of any one of ZnO, InZnO, ZnSnO, GaInZnO and ZrInZnO.

6. A method for fabricating an array substrate, comprising steps of:

forming a pattern comprising a gate line;

forming a pattern comprising an active layer of a thin film transistor;

forming a pattern comprising a metal oxide layer; and forming a pattern comprising a data line and a source and a drain of the thin film transistor, wherein the source and the drain are connected with the active layer, and the source is connected with the data line, wherein the metal oxide layer is provided at least below a portion of the data line overlapping with the gate line, and an upper surface of the metal oxide layer is in contact with a lower surface of the data line, and wherein the active layer of the thin film transistor includes a source covered region, a drain covered region and an etch stop layer covered region provided between the source covered region and the drain covered region, the metal oxide layer includes a source oxide layer provided at one side of the active layer and connected with the source covered region, a drain oxide layer provided at the other side of the active layer and connected with the drain covered region, and a data line oxide layer provided below the data line and in contact with the lower surface of the data line, one part of the lower surface of the source is in contact with the source covered region, the other part thereof is in contact with the source oxide layer, one part of the lower surface of the drain is in contact with the drain covered region, and the other part thereof is in contact with the drain oxide layer, and between the step of forming the pattern comprising the metal oxide layer and the step of forming the pattern comprising the data line and the source and the drain of the thin film transistor, the method further comprises a step of: forming a pattern comprising an etch stop layer, which is provided on the active layer and covers only the etch stop layer covered region.

7. The method according to claim 6, wherein the metal oxide layer is provided in the same layer as the active layer of the thin film transistor, the metal oxide layer is made of the same material as the active layer of the thin film transistor, and the patterns comprising the active layer of the thin film transistor and the metal oxide layer are formed in a same patterning process.

8. The method according to claim 6, wherein the metal oxide layer is made of any one of ZnO, InZnO, ZnSnO, GaInZnO and ZrInZnO.

9. A display device, comprising an array substrate, the array substrate comprising a plurality of data lines, a plurality of gate lines and a plurality of oxide thin film transistors, the plurality of data lines and the plurality of gate lines intersecting with each other in different planes to divide the array substrate into a plurality of pixel units, in each of which the oxide thin film transistor being provided, wherein the oxide thin film transistor comprises an active layer and a source and a drain which are connected with the active layer, the source is connected with the data line, the array substrate further comprises a metal oxide layer provided at least below a portion of the data line overlapping with the gate line, and an upper surface of the metal oxide layer is in contact with a lower surface of the data line, and an etch stop layer is provided on the active layer of the oxide thin film transistor, wherein the active layer of the oxide thin film transistor includes a source covered region, a drain covered region and an etch stop layer covered region provided between the source covered region and the drain covered region, the metal oxide layer includes a source oxide layer provided at one side of the active layer and connected with the source covered region, a drain oxide layer provided at the other side of the active layer and connected with the drain covered region, and a data line oxide layer provided below the data line and in contact with a lower surface of the data line, and one part of a lower surface of the source of the oxide thin film transistor is in contact with the source covered region, and the other part thereof is in contact with the source oxide layer, one part of a lower surface of the drain of the oxide thin film transistor is in contact with the drain covered region, and the other part thereof is in contact with the drain oxide layer, a lower surface of the etch stop layer is only in contact with the etch stop layer covered region.

10. The display device according to claim 9, wherein the metal oxide layer is provided at each overlapping portion of the data line with the gate line, a width of the metal oxide layer is equal to that of the data line, and a length of the metal oxide layer is equal to a width of the gate line.

11. The display device according to claim 9, wherein a width and a length of the metal oxide layer correspond to those of the data line, respectively.

12. The display device according to claim 9, wherein the metal oxide layer is made of the same material as the active layer of the oxide thin film transistor.

\* \* \* \* \*